United States Patent
Liu

[19]

[11] Patent Number: 6,147,377
[45] Date of Patent: Nov. 14, 2000

[54] FULLY RECESSED SEMICONDUCTOR DEVICE

[75] Inventor: Yowjuang W. Liu, San Jose, Calif.

[73] Assignee: Advanced Micro Devices, Inc., Sunnyvale, Calif.

[21] Appl. No.: 09/052,061

[22] Filed: Mar. 30, 1998

[51] Int. Cl.[7] .................................................. H01L 29/76
[52] U.S. Cl. ........................ 257/314; 257/315; 257/316; 257/317; 257/318; 257/319; 257/320; 257/330; 257/329; 257/332
[58] Field of Search ..................................... 257/314, 315, 257/316, 317, 318, 319, 320, 330, 329, 332

[56] References Cited

U.S. PATENT DOCUMENTS

| | | | |
|---|---|---|---|
| Re. 35,810 | 5/1998 | Prall | 438/257 |
| 4,835,741 | 5/1989 | Baglee | 365/185 |
| 4,979,004 | 12/1990 | Esquivel et al. | 357/23.5 |
| 4,990,979 | 2/1991 | Otto | 357/23.5 |
| 5,146,426 | 9/1992 | Mukherjee et al. | 365/149 |
| 5,315,142 | 5/1994 | Acovic et al. | 257/316 |
| 5,341,342 | 8/1994 | Brahmbhatt | 257/314 |
| 5,429,970 | 7/1995 | Hong | 437/43 |
| 5,488,244 | 1/1996 | Quek et al. | 257/314 |
| 5,729,496 | 3/1998 | Jung | 257/315 |
| 5,770,484 | 6/1998 | Kleinhenz | 438/155 |
| 5,801,075 | 9/1998 | Gardner et al. | 438/197 |
| 5,854,114 | 12/1998 | Li et al. | 438/296 |
| 5,859,459 | 1/1999 | Ikeda | 257/374 |
| 5,915,180 | 6/1999 | Hara et al. | 438/270 |
| 5,923,063 | 7/1999 | Liu et al. | 257/316 |

*Primary Examiner*—Carl Whitehead, Jr.
*Assistant Examiner*—Matthew E. Warren
*Attorney, Agent, or Firm*—Fenwick & West LLP

[57] ABSTRACT

A fully recessed device structure and method for low power applications comprises a trenched floating gate and a trenched control gate formed in a single trench etched into a well junction region in a semiconductor substrate to provide a substantially planar topography for low power applications. The trenched floating gate is electrically isolated from the trenched control gate by an inter-gate dielectric layer formed inside the trench and on a top surface of the trenched floating gate. The trenched control gate is formed on a top surface of the inter-gate dielectric layer and preferably, has a top surface which is substantially planar with a top surface of the semiconductor substrate. The fully recessed structure further comprises a buried source region, a buried drain region and a channel region. The buried source region and the buried drain region are formed in the well junction region and are laterally separated by the trench. The buried source region and the buried drain region have a depth slightly less than the depth of the trench. In one embodiment, the buried source and buried drain region have asymmetrical depths that are both approximately less than the depth of the trench. In one embodiment of the present invention, sidewall dopings are formed in the substrate to shield the trenched control gate from the buried source and buried drain regions.

14 Claims, 7 Drawing Sheets

FULLY RECESSED SEMICONDUCTOR DEVICE

RELATED APPLICATIONS

The subject matter of this application is related to the subject matter of commonly-assigned U.S. patent applications having the following serial numbers and titles: Ser. No. 09/052,059, Fully Recessed Semiconductor Device and Method; and Ser. No. 09/052,060, Fully Recessed Semiconductor Device and Method for Low Power Applications With Single Wrap Buried Drain Region, all concurrently filed herewith.

FIELD OF THE INVENTION

The subject matter of this invention relates to semiconductor devices and methods of manufacture, and more particularly, to semiconductor devices and methods of manufacture having a trenched floating gate and a trenched control gate.

BACKGROUND OF THE INVENTION

Conventional semiconductor non-volatile memories, such as read-only memories (ROMs), erasable-programmable ROMs (EPROMs), electrically erasable-programmable ROMs (EEPROMs) and flash EEPROMs are typically constructed using a double-gate structure. FIG. 1 is a cross-sectional view of the device structure of a conventional nonvolatile memory device 100 including a substrate 102 of a semiconductor crystal such as silicon. The device 100 further includes a channel region 104, a source region 106, a drain region 108, a floating gate dielectric layer 110, a floating gate electrode 112, an inter-gate dielectric layer 114, and a control gate electrode 116. The floating gate dielectric layer 110 isolates the floating gate electrode 112 from the underlying substrate 102 while the inter-gate dielectric 114 isolates the control gate electrode 116 from the floating gate electrode 112. As shown in FIG. 1, the floating gate dielectric layer 110, the floating gate electrode 112, the inter-gate dielectric layer 114, and the control gate electrode 116 are all disposed on the surface of the substrate 102.

As semiconductor devices and integrated circuits are scaled down in size, demands for the efficient use of space have increased. Heretofore, conventional semiconductor memories have utilized a double-gate structure in which both gates being formed on the surface of the silicon substrate as shown in FIG. 1. This type of device structure for non-volatile devices is limited to the degree to which active devices can be made smaller in order to increase packing density. Moreover, when the double gates are stacked on top of the substrate surface as shown in FIG. 1, difficulties in the subsequent contact etch process are created due to the uneven and non-uniform topology.

SUMMARY OF THE INVENTION

In accordance with the present invention, a semiconductor device for low power applications is fabricated to include a fully recessed cell structure comprising a trenched floating gate and a trenched control gate. The trenched floating gate and the trenched control gate are both formed in a single trench etched into a well junction region formed in a semiconductor substrate. A buried source region and a buried drain region are formed in the well junction region and are laterally separated by the fully recessed trenched gate structure. The lower boundaries of the buried source region and the buried drain region have a depth which is approximately less than the depth of the trench. The upper boundaries of the buried source region and the buried drain region are of approximately the same depth as the top surface of the trenched floating gate. A fully recessed trenched gate structure embodying the principles of the present invention provides a substantially planar topography that improves the packing density and scaleability of the device. Additionally, the present invention provides low substrate current programming and an enhanced erase operation.

In one embodiment of the present invention, a fully recessed trenched gate device structure for a non-volatile semiconductor device includes a trenched floating gate and a trenched control gate both formed in a single trench etched into the semiconductor substrate. The fully recessed cell structure further includes a well junction region. A buried source region and a buried drain region are formed in the well junction region. The trench is formed in the well junction region and laterally separates the buried source and the buried drain regions. The trenched floating gate is electrically isolated from the trench by a trench-to-gate dielectric layer formed on substantially vertical sidewalls and on a bottom surface inside the trench. An inter-gate dielectric layer is formed on the trenched floating gate and electrically isolates the trenched floating gate from the trenched control gate. The trenched control gate is formed on the inter-gate dielectric layer and in a preferred embodiment, has a top surface which is substantially planar with a surface of the substrate.

In one embodiment of the present invention, sidewall dopings of one conductivity type are formed in the semiconductor substrate. The sidewall dopings are immediately contiguous the substantially vertical sidewalls of the trench and the substrate surface. The depth of the sidewall dopings is approximately equal to or greater than the depth of the trenched control gate and partially extend into the buried source and buried drain regions.

In another embodiment of the present invention, an implanted region of one conductivity type is formed in the semiconductor substrate. The implanted region is laterally separated by the trench and is immediately contiguous the substantially vertical sidewalls of the trench, the substrate surface and the upper boundaries of the buried source region and the buried drain region.

In accordance with the present invention, a fully recessed device structure is formed in a semiconductor substrate using an MOS fabrication process according to which a well junction region is formed in the substrate. A trench is then etched into the well junction region. A trench-to-gate insulating layer is formed on substantially vertical sidewalls and on a bottom surface inside the trench. A trenched floating gate is fabricated by first depositing a layer of polysilicon over the substrate and then etching the polysilicon layer. An inter-gate dielectric is then deposited on the trenched floating gate inside the trench to isolate the two gate electrodes. The trenched control gate is formed by first depositing a layer of polysilicon over the substrate and then planarizing the polysilicon layer until it is substantially planar with the substrate surface. Finally, a buried source region and a buried drain region are formed in the well junction region. In one embodiment, sidewall dopings are formed in the substrate and are immediately contiguous the substantially vertical sidewalls of the trench and immediately contiguous the substrate surface.

DESCRIPTION OF THE PREFERRED EMBODIMENT

Figure 1:
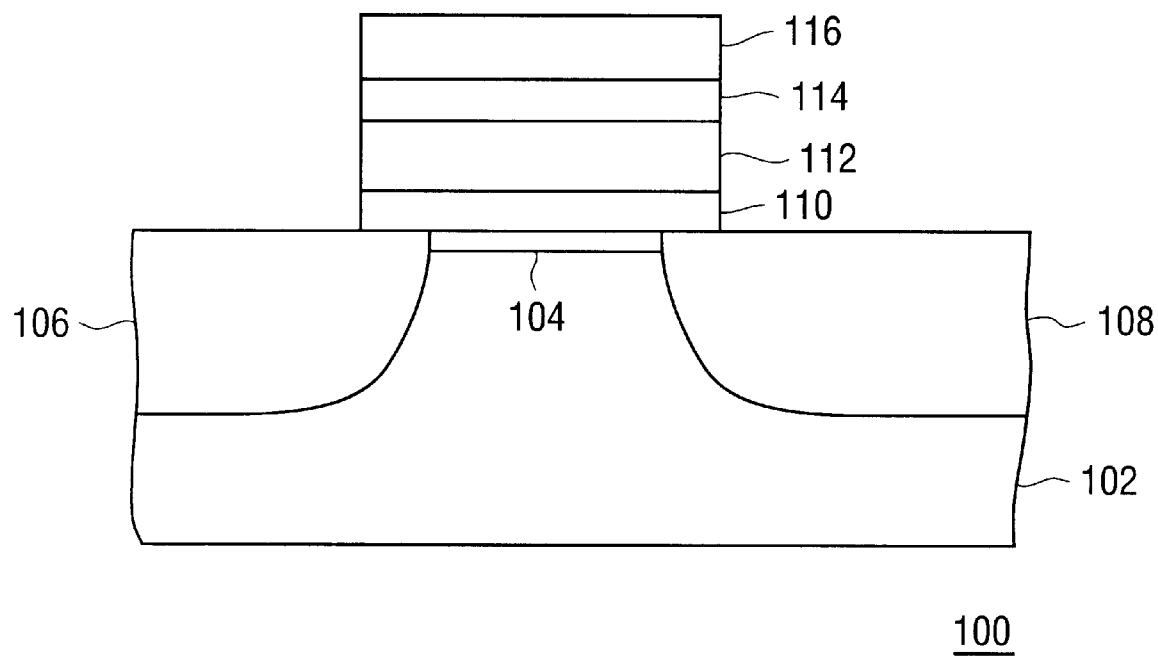
FIG. 1 is a cross-sectional view of a conventional non-volatile device.
Figure 2A:
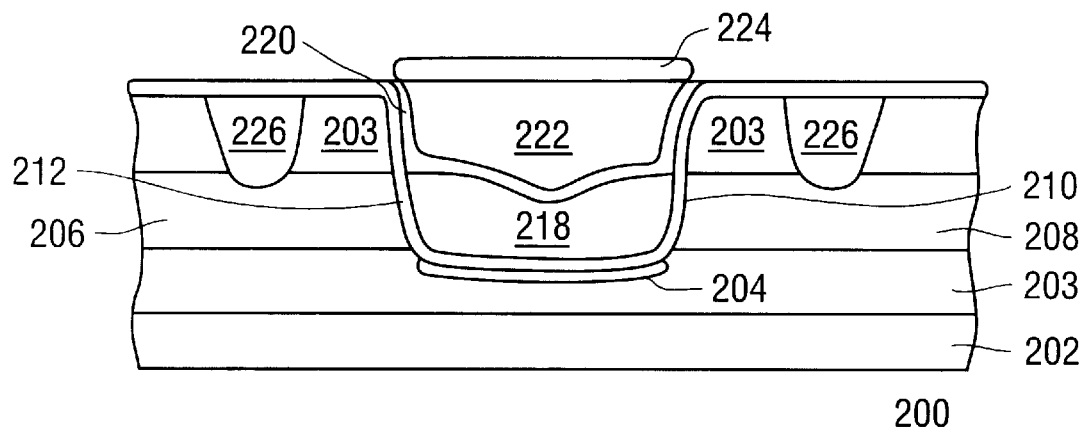
FIGS. 2A–2C are cross-sectional views of a device structure embodying the principles of the present invention.

FIG. 2A is a cross-sectional view of one embodiment of a non-volatile device embodying the principles of the present invention. FIG. 2A shows a semiconductor structure 200 including a substrate 202 of monocrystalline silicon semiconductor material according to one embodiment of the present invention. The substrate 202 is preferably n-doped or provided with an n-well to a suitable threshold voltage level in accordance with conventional silicon semiconductor fabrication techniques. Semiconductor structure 200 also includes a well junction region 203, preferably p-type, formed in semiconductor substrate 202. Structure 200 also includes a channel region 204, a buried source region 206, a buried drain region 208, a trench 210, and a trench-to-gate insulating layer 212. Structure 200 further includes a trenched floating gate electrode 218, an inter-gate dielectric layer 220 formed in trench 210, and a trenched control gate electrode 222. Trenched control gate electrode 222 is formed over inter-gate dielectric layer 220 and in a preferred embodiment has a top surface which is substantially planar with a top surface of substrate 202. In one embodiment of the present invention, a layer of tungsten silicide 224 is formed on the top surface of substrate 202. Source and drain contacts 226 are also formed in the substrate and partially extend into the buried source and buried drain regions 206, 208.

Buried source region 206 and buried region 208 are diffusion regions of semiconductor material that are doped with impurities that have a conductivity opposite to the conductivity of well junction region 203. For example, when well junction region 203 is p-doped, then the opposite conductivity type is n-doped. Preferably buried source region 206 and buried drain region 208 are doped with "donor" or n-type impurities of phosphorous, arsenic or the like in conventional manner with a dose range on the order of approximately 5E14 atoms cm$^{-2}$ to approximately 1E16 atoms cm$^{-2}$. Buried source region 206 and buried drain region 208 are laterally separated by trench 210 and are immediately contiguous the substantially vertical sidewalls of trench 210. Buried source region 206 and buried drain region 208 are diffusion regions which have an upper boundary which is below the top surface of the substrate and a lower boundary, i.e. the boundary closest to a bottom surface of the semiconductor substrate, which is approximately less than the depth of trench 210. The upper boundaries, i.e. the boundaries closest to a top surface of the semiconductor substrate, of buried source region 206 and buried drain region 208 are at approximately the same depth as the top surface of trenched floating gate 218. In one embodiment, buried source region 206 may have a different depth than that of buried drain region 208 with both depths still being approximately less than the depth of trench 210. Channel region 204 is an implanted region formed beneath the bottom surface of trench 210. In a preferred embodiment, channel region 204 is a depletion type channel region. According to one embodiment of the present invention, trench 210 is between pproximately 100 Å and 5000 Å wide and from approximately 100 Å to 5000 Å deep. Trench-to-gate insulating layer 212 is formed on substantially vertical sidewalls and a bottom surface inside trench 210 and has preferably a high dielectric constant (K). Preferably, the thickness of trench-to-gate insulating layer 212 is scaled according to the width of trench 210 to comprise only an insignificant part of the dimensions of trench 210. Trench-to-gate insulting layer 212 may comprise a uniform thickness on the vertical sidewalls and the bottom surface of trench 210. Alternatively, the thickness of trench-to-gate insulating layer 212 may be thicker on the substantially vertical sidewalls inside trench 210 than on the bottom surface inside the trench. Insulating layer 212 is preferably a nitridized thermal oxide, a deposited high temperature oxide (HTO), or composited dielectric films with a K approximately equal to or greater than 4.0. Moreover, trench-to-gate insulating layer 212 may comprise either one film formed on both the sidewalls and the bottom surface inside trench 210 or it may comprise one type of film formed on the sidewalls inside trench 210 and a different film formed on the bottom surface inside trench 210. Trenched floating gate electrode 218 is formed inside trench 210 on trench-to-gate insulating layer 212 which electrically isolates the trenched floating gate electrode 218 from trench 210. Trenched floating gate electrode 218 comprises a conductive material such as polysilicon, preferably doped with n-type material, or a layer of polysilicide, and has a final thickness which is approximately equal to one half of the depth of trench 210. In other words, a top surface of trenched floating gate electrode 218 is disposed at approximately one half the depth of trench 210. Inter-gate dielectric layer 220 is formed on trenched floating gate electrode 218 inside trench 210 and electrically isolates trenched floating gate electrode 218 from trenched control gate electrode 222. In one embodiment, an additional spacer dielectric may also be formed at the upper sidewalls inside trench 210 in order to further decouple the trenched control gate from the buried source and buried drain regions. Inter-gate dielectric layer 220 is preferably a high K dielectric material, such as an Oxide-Nitride-Oxide (ONO) layer formed in conventional manner on trenched floating gate electrode 218 inside trench 210. Trenched control gate electrode 222 is a conductive material, such as polysilicon, preferably doped with n-type material, or polysilicide formed on inter-gate dielectric layer 220 and preferably, has a top surface which is substantially planar with a top surface of substrate 202. Trenched control gate electrode 222 substantially fills the remainder of trench 210 to a thickness which is approximately equal to one half the depth of trench 210. In a preferred embodiment, a layer of tungsten silicide 224 is also formed on the top surface of trenched control gate electrode 222. Contacts 226 to buried source region 206 and buried drain region 208 may also be formed in the semiconductor substrate and partially extend into buried source region 206 and buried source region 208.

One advantage of the present invention is the substantially planar topography of the fully recessed device structure. The substantially planar topography improves the packing density and scaleability of the device as well as the manufacturability of the device. Because the trenched floating gate electrode and the trenched control gate electrode are both formed in a single trench etched into the semiconductor substrate, the fully recessed device structure is self-aligned. In other words, the trenched control gate electrode and the trenched floating gate electrode are self-aligned, and the trenched gates and the source and drain regions are self-aligned.

Embodiments employing the principles of the present invention also provide low substrate current programming suitable for low power applications. While the operation of the present invention will be described in terms of an n-p-n device, it should be recognized that the operation of a p-n-p device is also possible by biasing the electrodes with an opposite polarity. Each individual cell in a device may be selectively programmed one at a time by positively biasing trenched control gate electrode 222, grounding drain region 208, and floating source region 206 and substrate 202 which results in an injection of electrons into trenched floating gate 218 through the vertical sidewall of trench 210 adjacent to drain region 208. Because source region 206 and substrate 202 are floating, no substrate current is generated during the programming operation. Devices employing the principles of the present invention provide erasure of the entire device at the same time. The device is erased by biasing source region 206, well junction region 203, and drain region 208 and creating a voltage differential across trenched floating gate 218 and trenched control gate 222. The voltage differential may be created by grounding trenched control gate 222 and positively biasing well junction region 203, source junction 206, and drain junction 208, or by negatively biasing trenched control gate 222 and grounding or positively biasing well junction region 203, source junction 206, and drain junction 208.

Figure 2B:
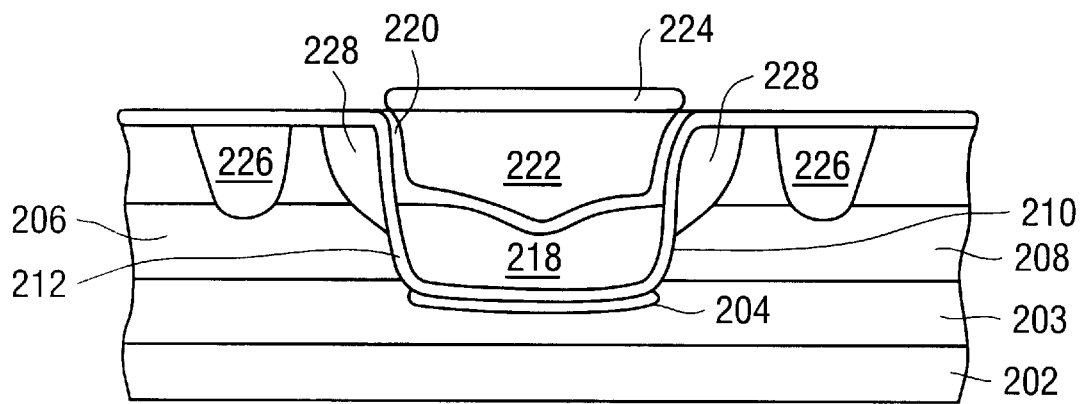

FIG. 2B is a cross-sectional view of one embodiment of the present invention. In such embodiment, sidewall dopings 228 are formed in the semiconductor substrate by implanting the substrate at a large angle in conventional manner with dopant impurities of one conductivity type. Sidewall dopings 228 are immediately contiguous the upper vertical sidewalls of trench 210 and immediately contiguous the substrate surface as shown in FIG. 2B. The depth of sidewall dopings 228 is approximately equal to or greater than the depth of trenched control gate 222 but less than the depth of trench 210 to allow electrons to flow to and from buried drain region 208 and from and to trenched floating gate electrode 218 through the sidewalls of trench 210 for program and erase operations, and partially extend into buried source region 206 and buried drain region 208. Thus, sidewall dopings 228 are preferably deep enough to shield trenched control gate electrode 222 from buried source and buried drain regions 206, 208. Sidewall dopings 228 are of the same conductivity type as well junction region 203 and are preferably doped with "acceptor" or p-type impurities, such as boron, and are formed using an ion implant in conventional manner at a large angle, preferably 15 to 75 degrees, with an implant dose range on the order of 1E13 atoms cm$^{-2}$ to on the order of 1E15 atoms cm$^{-2}$. The convention for determining the angle of the implant as used in this specification is relative to the axis which is normal to the top surface of the substrate. In other words, 0 degrees means an implant along the axis which is normal to the top surface of the substrate and 90 degrees means an implant which is parallel to the top surface of the substrate.

Sidewall dopings 228 in accordance with the present invention minimize the sensitivity to misalignments between trenched control gate 222 and the buried source and buried drain regions 206, 208 by reducing the coupling between trenched control gate electrode 222 and buried source region 206 and buried drain region 208. Additionally, sidewall dopings 228 reduce leakages of electrons from the trenched gate electrodes through the sidewalls of the trench.

Figure 2C:
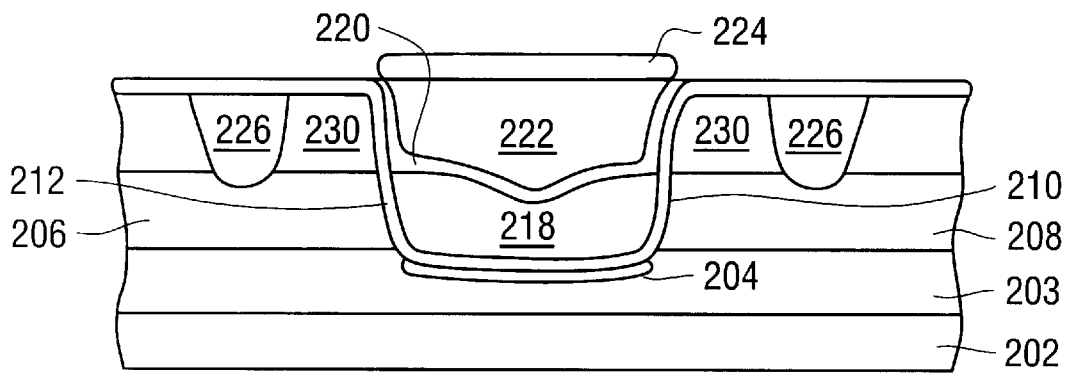

FIG. 2C is a cross-sectional view of yet another embodiment of the present invention. In such embodiment, an implanted region 230, preferably doped with "acceptor" or p-type impurities, is formed in the semiconductor substrate. Implanted region 230 is laterally separated by trench 210 and is immediately contiguous the sidewalls of trench 210, the substrate surface and the upper boundaries of buried source region 206 and buried drain region 208 as shown in FIG. 2C. Implanted region 230 is formed in the semiconductor substrate by implanting the substrate in conventional manner preferably after trenched control gate 222 is formed. The depth of implanted region 230 is approximately equal to or greater than the depth of trenched control gate 222 and is determined by the ion implant used to form buried source region 206 and buried drain region 208. In other words, the upper boundary of buried source region 206 and buried drain region 208 is immediately contiguous the lower boundary of implanted region 230. Thus, implanted region 230 is preferably deep enough to shield trenched control gate electrode 222 from buried source and buried drain regions 206, 208. Implanted region 230 is of the preferably doped with "acceptor" or p-type impurities, such as boron, and are formed using an ion implant in conventional manner with an implant dose range on the order of 1E12 atoms cm$^{-2}$ to on the order of 1E15 atoms cm$^{-2}$.

Implanted region 280 in accordance with the present invention minimizes the sensitivity to misalignments between trenched control gate 222 and buried source and buried drain regions 206, 208 by reducing the coupling between trenched control gate electrode 222 and buried source region 206 and buried drain region 208. Additionally, implanted region 230 reduces leakages of electrons from the trenched gate electrodes through the sidewalls of trench 210.

While the present invention has been described in terms of a simple device structure, it should be noted that the underlying structure of the present invention may be coupled to other device structures on the common substrate in order to form an array for a semiconductor device, such as a memory array. Preferably, a layer of tungsten silicide or tungsten is used to interconnect the trenched control gates of multiple device structures in a semiconductor device. The method for forming the tungsten silicide or tungsten interconnects is described below in more detail with reference to FIG. 3I.

Figure 3A:
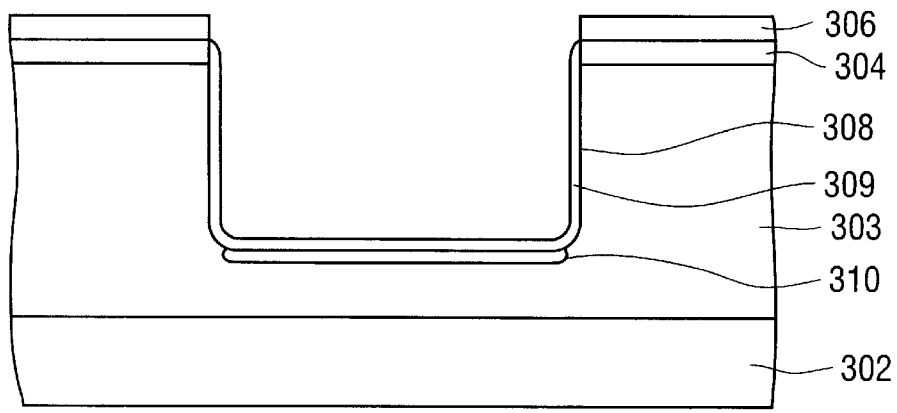
FIGS. 3A–3N are cross-sectional views of a semiconductor substrate in various stages of processing in accordance with one embodiment of the present invention.
Figure 3B:
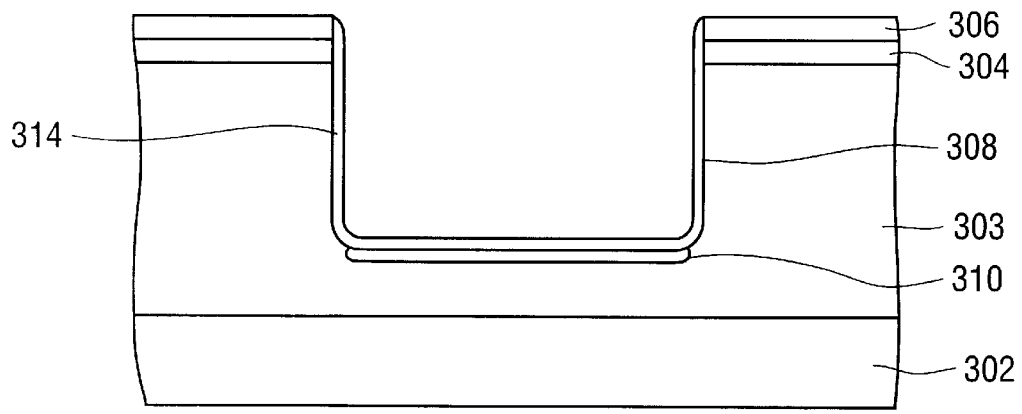
Figure 3C:
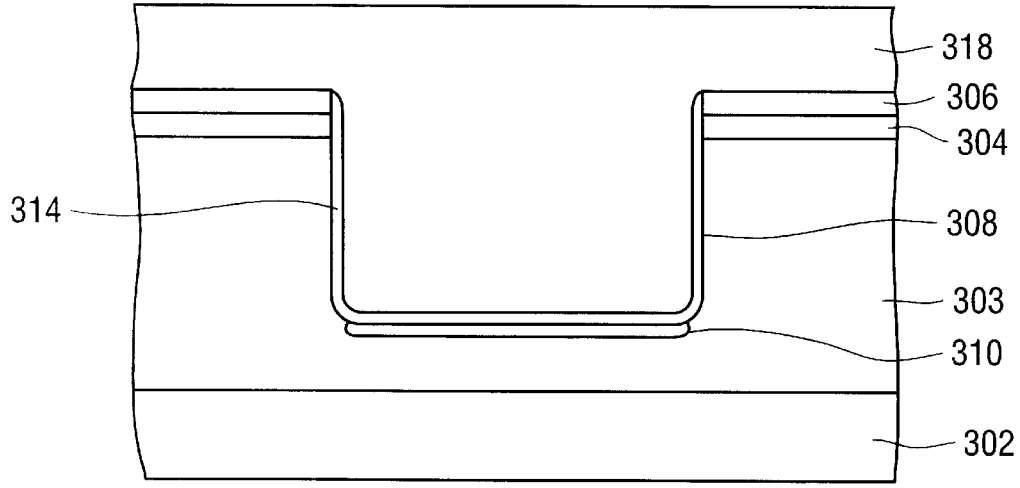
Figure 3D:
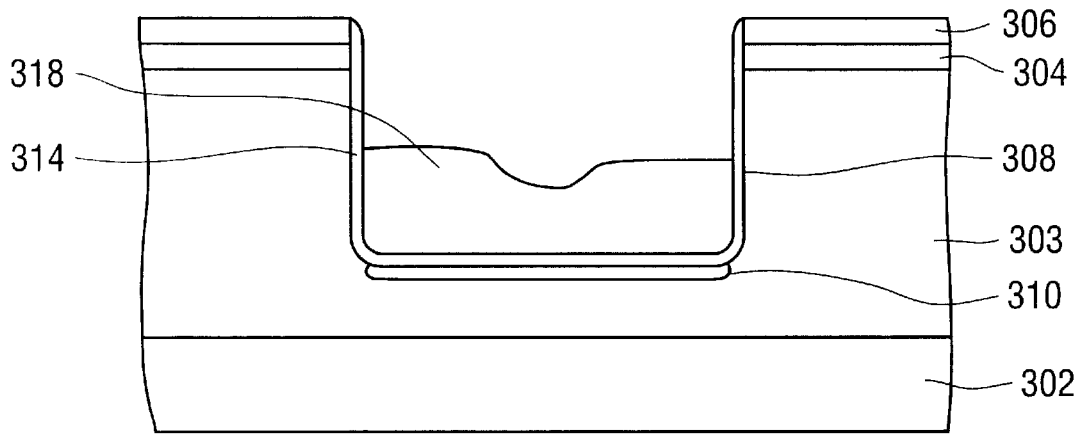
Figure 3E:
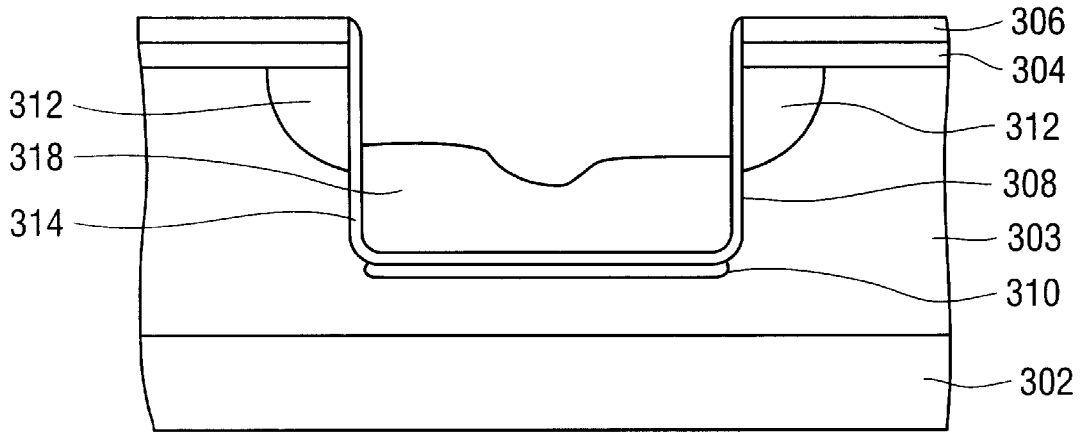
Figure 3F:
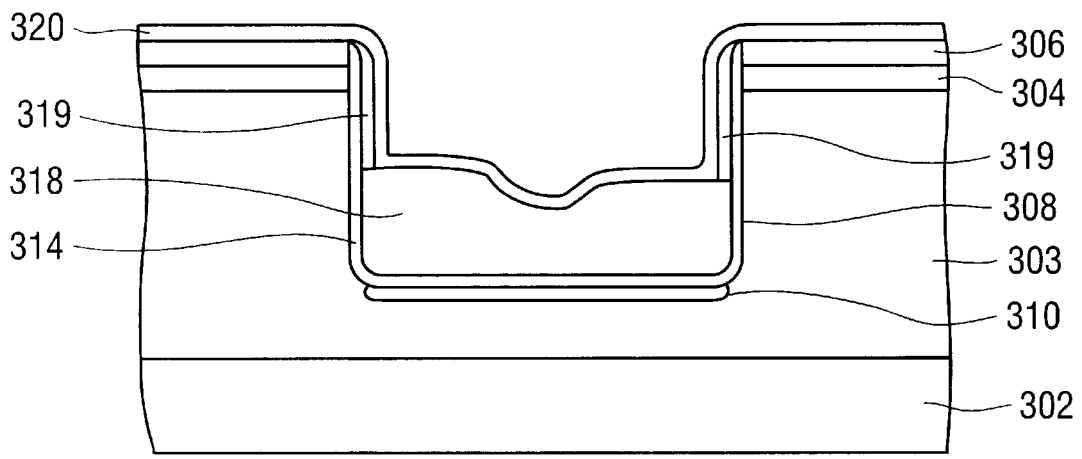
Figure 3G:
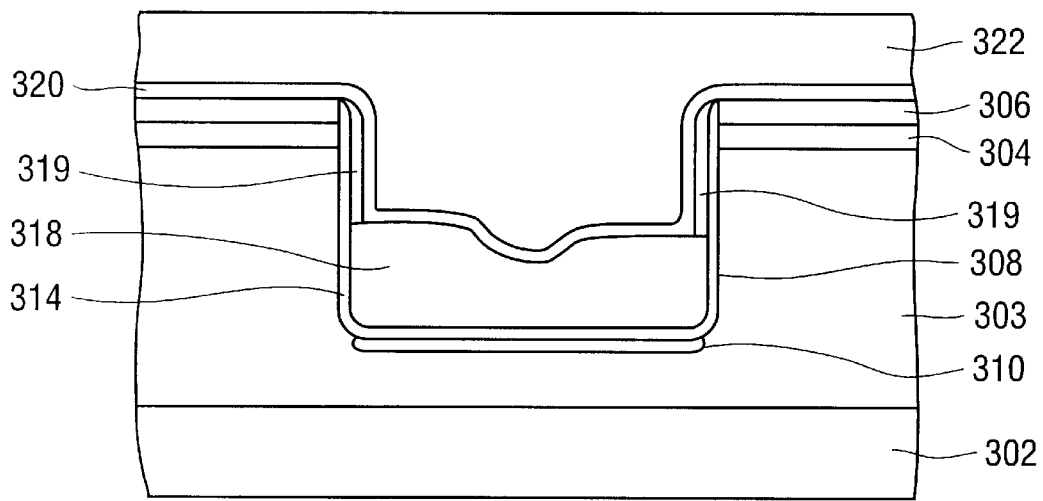
Figure 3H:
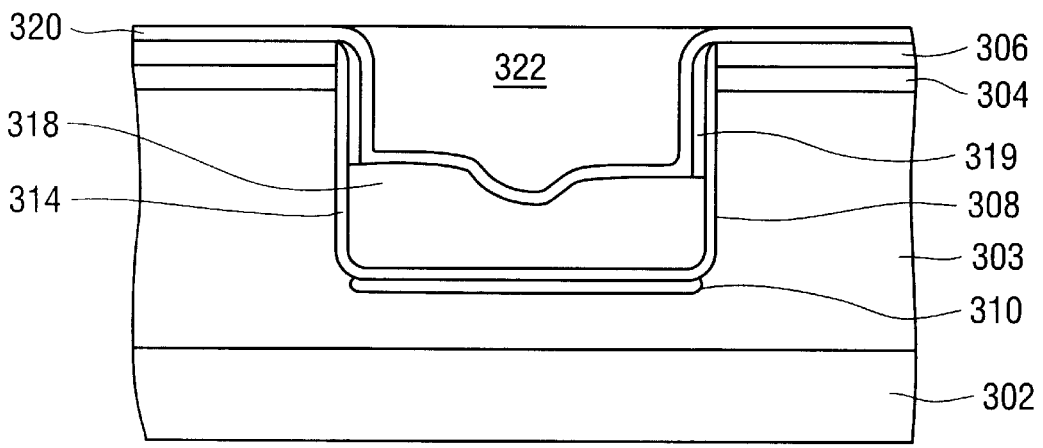
Figure 3I:
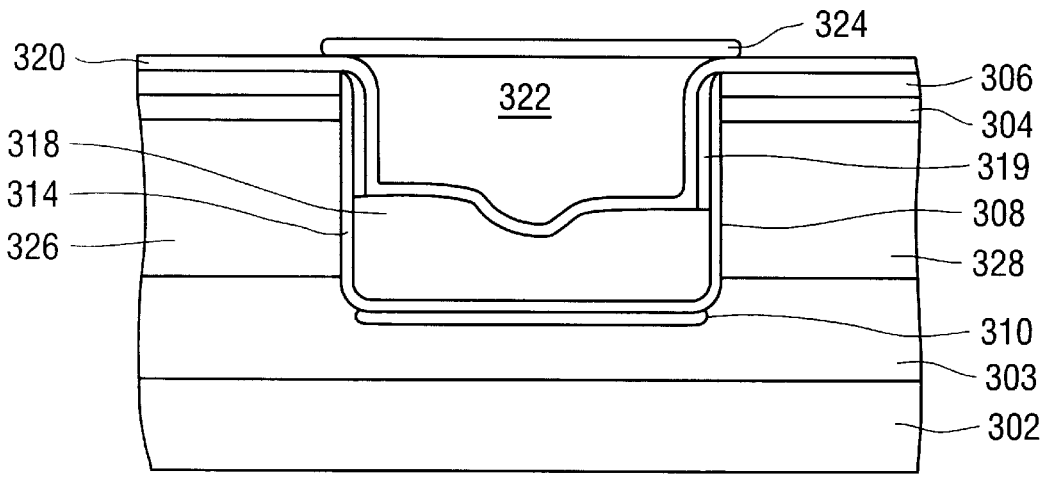
Figure 3J:
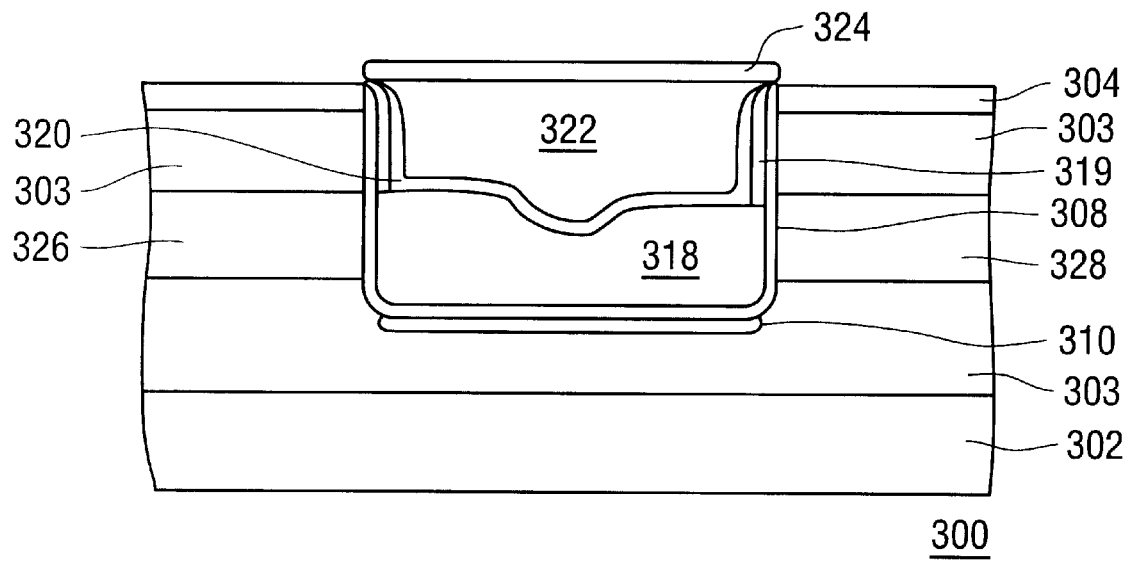
Figure 3K:
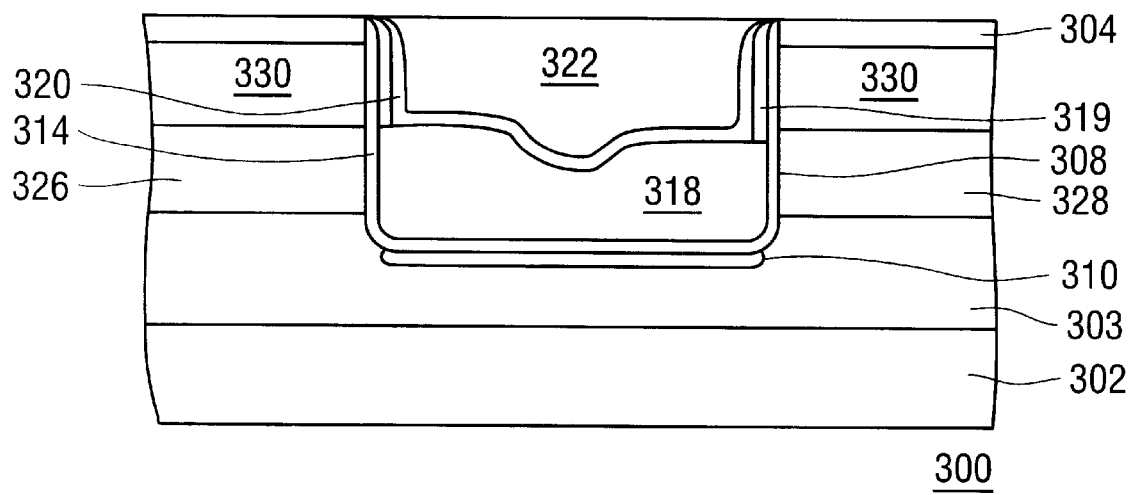
Figure 3L:
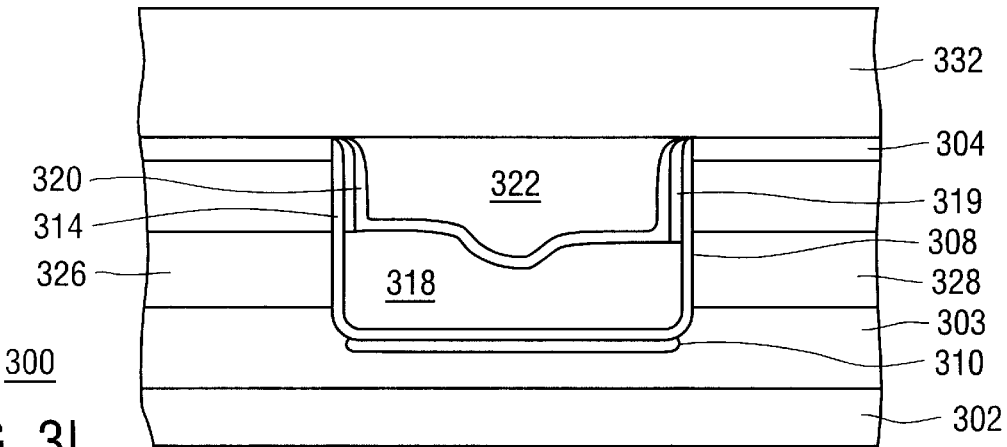
Figure 3M:
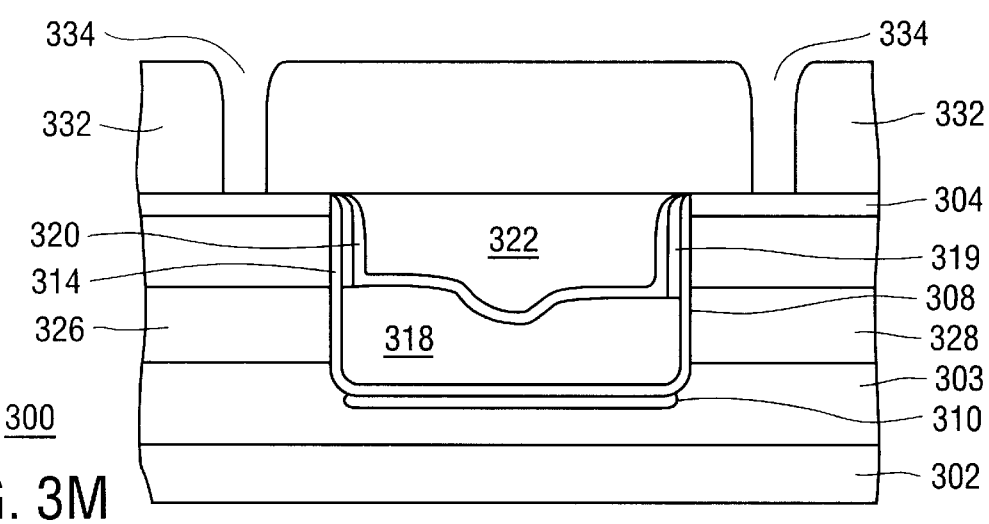
Figure 3N:
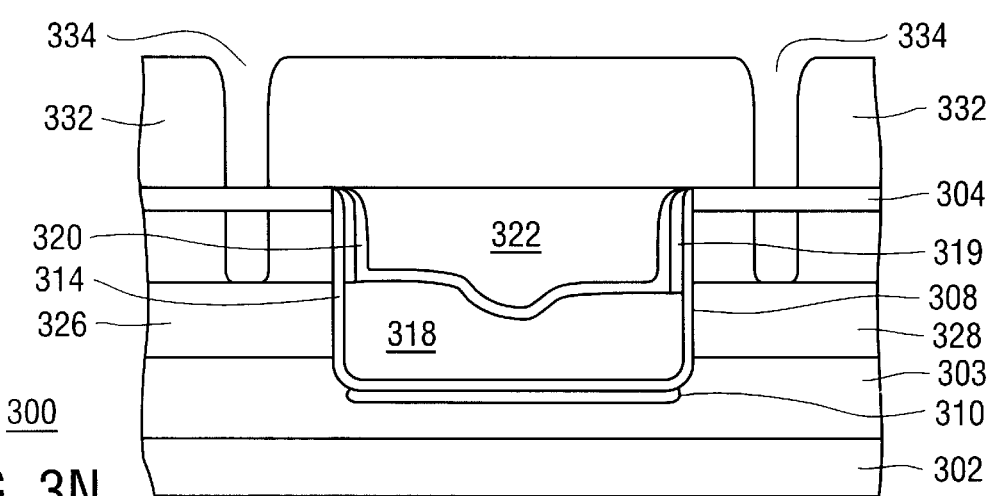

FIG. 3A–3N are cross-sectional views of the semiconductor substrate in various stages of processing in accordance with one embodiment of the present invention. While the present invention will now be described in terms of fabricating a single device structure, it should be noted that the underlying process of the present invention may be employed to fabricate multiple devices at spaced locations on a single substrate. FIG. 3A is a cross-sectional view of a semiconductor wafer 300 comprising a substrate 302, a well-junction region 303, a first pad oxide layer 304, a nitride layer 306, a trench 308, a second pad oxide layer 309 and a channel region 310. The substrate 302 is preferably an n-doped silicon substrate cut from a single silicon crystal. Well junction region 303 is preferably p-doped. First pad oxide layer 304 is approximately 100 Å thick and provides stress relief between substrate 302 and nitride layer 306. Nitride layer 306 has a thickness of approximately 1500 Å and preferably comprises silicon nitride ($Si_3N_4$). Nitride layer 306 serves as a masking layer or etch stop for subsequent oxidation, chemical-mechanical polishing (CMP), and etching steps. The nitride layer 306 and oxide layer 304 sandwich can also be used as an isolation mask material. Thus, the steps for forming the fully recessed gate trench may be integrated into conventional CMOS process flows. First pad oxide layer 304 and nitride layer 306 may be deposited in conventional manner by chemical vapor deposition (CVD) or other techniques. Trench 308 is formed in conventional manner using a reactive ion etch (RIE) to remove the silicon substrate. The trench etching process may include multiple steps such as a nitride etch, an oxide etch and a high selectivity silicon to oxide etch. Second pad oxide layer 309 is grown in conventional manner inside trench 308. Preferably, second pad oxide layer 309 has a thickness of approximately 200 Å when trench 308 is approximately 3000 Å to 5000 Å wide. Channel region 310 is preferably formed using ion implantation of phosphorous in conventional manner with a dose range on the order of approximately 1E10 atoms cm$^{-2}$ to on the order of 1E13 atoms cm$^{-2}$ and an energy of approximately 1 keV to 60 keV at an angle of approximately 0 degrees in order to form a depletion type channel region to achieve a low threshold voltage. Alternatively, channel region 310 may be formed using an ion implantation of boron in conventional manner.

Next, a trench-to-gate dielectric layer is deposited in trench 308 to isolate the trenched floating gate electrode from trench 308. FIG. 3B is a cross-sectional view of semiconductor wafer 300 following formation of trench-to-gate insulating layer 314. In a preferred embodiment, second pad oxide layer 309 is removed in conventional manner prior to forming trench-to-gate insulating layer 314. Typically, an insulating layer, such as a layer of thermally grown or deposited oxide, preferably nitridized, is formed in conventional manner on the substantially vertical sidewalls and on the bottom surface inside trench 308. Preferably, the nitridized oxide has a K higher than about 4.0. Alternatively, trench-to-gate insulating layer 314 may be formed with a different thickness on the substantially vertical sidewalls inside trench 310 than the thickness on the bottom surface inside trench 310.

Semiconductor wafer 300 is then deposited with a layer of polysilicon 318 to form the trenched floating gate. FIG. 3C is a cross-sectional view of semiconductor wafer 300 following deposition of a layer of polysilicon 318. The thickness of polysilicon layer 318 is selected according to the depth of trench 308. In a preferred embodiment of the invention, the thickness of polysilicon layer 318 is between about 1000 Å and 10,000 Å. Typically, polysilicon layer 318 may be formed in conventional manner by low pressure chemical vapor deposition (LPCVD) and can be doped in situ in conventional manner.

Polysilicon layer 318 subsequently undergoes a polish, a plasma etch or a combination of a polish and plasma etch in conventional manner to remove portions of the polysilicon. FIG. 3D is a cross-sectional view of semiconductor wafer 300 following a plasma etch of polysilicon layer 318.

In one embodiment of the present invention, sidewall dopings are formed in the semiconductor substrate. After trenched floating gate 318 has been formed in trench 308, semiconductor wafer 300 is implanted with dopant impurities of one conductivity type to form sidewall dopings 312. FIG. 3E is a cross sectional view of semiconductor wafer 300 following implantation of sidewall dopings 312. Preferably, boron is implanted at a large angle around 15 to 75 degrees with a dose range on the order of approximately 1E13 atoms cm$^{-2}$ to on the order of 1E15 atoms cm$^{-2}$ and with an energy ranging from approximately 1 to 60 keV. Alternatively, sidewall dopings 312 may also be formed after forming inter-gate dielectric layer 320.

In a preferred embodiment, a trench sidewall spacer 319 may be formed at the upper substantially vertical surfaces of trench-to-gate insulating layer 314 inside trench 308 in order to further shield the trenched control gate electrode from the source and drain regions. Trench sidewall spacer 319 is immediately contiguous both trench-to-gate insulating layer 314 and a portion of a top surface of trenched floating gate electrode 318. Inter-gate dielectric layer 320 is then deposited on wafer 300 to form an insulating layer on trenched floating gate electrode 318 and trench sidewall spacer 319 inside trench 308. FIG. 3F is a cross-sectional view of semiconductor wafer 300 after forming trench sidewall spacer 319 and inter-gate dielectric 320. The inter-gate dielectric 320 is preferably an oxide-nitride-oxide (ONO) layer formed in conventional manner. After inter-gate dielectric 320 has been formed over substrate 302 a second layer of polysilicon or a layer of polysilicide 322 is deposited in conventional manner to form the trenched control gate for non-volatile devices. FIG. 3G is a cross-sectional view of semiconductor wafer 300 after second layer of polysilicon 322 has been deposited. The final thickness of second polysilicon layer or layer of polysilicide 322 is approximately one half the depth of trench 308. Second layer of polysilicon 322 is subsequently planarized to remove portions of the polysilicon. FIG. 3H is a cross-sectional view of semiconductor wafer 300 following planarization of second layer of polysilicon 322. Second layer of polysilicon 322 is planarized by using conventional techniques such as a chemical-mechanical planarization (CMP) with nitride layer 306 acting as an etch stop.

After formation of trenched control gate 322, a layer of tungsten silicide 324 is formed on a top surface of trenched control gate 322. FIG. 3I is a cross-sectional view of semiconductor wafer 322 after formation of tungsten silicide 324 on trenched control gate 322. When connecting trenched control gate 322 to other device structures on the common substrate to fabricate a semiconductor device, such as a memory array, tungsten silicide layer 324 or a layer of tungsten can be patterned in conventional manner to interconnect multiple devices. During this process, oxide layer 304 and nitride layer 306 protect the other regions of the device structure. Tungsten silicide layer 324 on the top surface of trenched control gate 323 provides additional protection for trenched control gate 322 during the subsequent formation of the buried source region and the buried drain region. Then, inter-gate dielectric layer 320 and nitride layer 306 are removed in conventional manner.

Semiconductor wafer 300 then undergoes a deep implant in conventional manner with dopant impurities of one conductivity type to form a buried source region 326 and buried drain region 328. FIG. 3J is a cross-sectional view of semiconductor wafer 300 after formation of buried source region 326 and buried drain region 328. Preferably, multiple ion implantations of arsenic, phosphorous, or a combination of arsenic and phosphorous with a dose range on the order of 5E14 atoms cm$^{-2}$ to on the order of 1E16 atoms cm$^{-2}$ are performed at different implant energies. The purpose of multiple implants at different implant energies is to form source and drain junctions with a depth approximately less than the depth of trench 308. The upper boundaries of buried source region 326 and buried drain region 328 are approximately at the same depth as the top surface of the trenched floating gate. In one embodiment, buried source region 326 and buried drain region 328 have asymmetrical depths which are still approximately less than the depth of the trench.

In another embodiment of the present invention, semiconductor wafer 300 is implanted with dopant impurities of one conductivity type to form implanted region 330. Implanted region 330 is formed by first performing a shallow implant in conventional manner with dopant impurities of one conductivity type, preferably p-type. FIG. 3K is a cross sectional view of semiconductor wafer 300 following a shallow implant. In one embodiment of the present invention, boron is implanted with a dose range on the order of approximately 1E12 atoms cm$^{-2}$ to on the order of 1E15 atoms cm$^{-2}$ and with an energy ranging from approximately 1 to 60 keV. The resulting implanted region is immediately contiguous the vertical sidewalls of the trench 308, the substrate surface and the upper boundaries of buried source region 326 and buried drain region 328.

Next, semiconductor wafer 300 is deposited in conventional manner with an interlayer dielectric 332. FIG. 3L is a cross-sectional view of semiconductor wafer 300 following deposition of interlayer dielectric 332. Interlayer dielectric 332 may be any number of films such as Tetra-Ethyl-Ortho-Silicate (TEOS), a high temperature oxide (HTO), or a low temperature oxide (LTO).

Interlayer dielectric 332 is then masked and etched in conventional manner to form contact openings. FIG. 3M is a cross-sectional view of semiconductor wafer 300 after forming contact openings 334. Contact openings 334 are preferably formed using an RIE etch in conventional manner.

After forming contact openings 334, semiconductor wafer 300 is implanted through contact opening 334 with dopant impurities of one conductivity type to form contacts 336 to buried source region 326 and buried drain region 328. FIG. 3N is a cross-sectional view of semiconductor wafer 300 after formation of contacts 336 to buried source and buried drain regions 326,328 and final formation of sidewall dopings 330. Finally, standard processing techniques are used to complete processing of semiconductor wafer 300.

What is claimed is:

1. A semiconductor transistor for low power applications formed in a semiconductor substrate having a top surface comprising:
   a well junction region of one conductivity type formed in the semiconductor substrate;
   a trench formed in the well junction region intermediate a source region and a drain region within the semiconductor substrate and having substantially vertical sidewalls and a bottom surface, the bottom surface being disposed at a first depth;
   said source region being formed of opposite conductivity type in the well junction region having a lower boundary disposed at a second depth, the second depth being less than the first depth of the trench relative to the top surface of the semiconductor substrate;
   said drain region being formed of the opposite conductivity type in the well junction region spaced from the source region and having a lower boundary disposed at a third depth, the third depth being less than the first depth of the trench relative to the top surface of the semiconductor substrate;
   a channel region formed beneath the bottom surface of the trench;
   a trench-to-gate insulating layer formed on the sidewalls and on the bottom surface inside the trench;
   a trenched floating gate electrode formed inside the trench and on the trench-to-gate insulating layer to a depth below the top surface;
   an inter-gate dielectric layer formed inside the trench on the trenched floating gate electrode; and
   a trenched control gate electrode formed inside the trench and on the inter-gate dielectric layer.

2. The semiconductor transistor of claim 1 wherein the trenched control gate electrode has a top surface that is substantially planar with the top surface of the semiconductor substrate.

3. The semiconductor transistor of claim 1 further comprising:
   sidewall dopings of the opposite conductivity type formed in the source region and drain region, the sidewall dopings being immediately contiguous the substantially upper vertical sidewalls of the trench and the top surface of the semiconductor substrate, and partially extending into the source and drain region.

4. The semiconductor transistor of claim 1 further comprising:
   an implanted region formed in the semiconductor substrate and immediately contiguous the upper substantially vertical sidewalls of the trench and the substrate surface.

5. The semiconductor transistor of claim 1 wherein the source region is a buried source region and the drain region is a buried drain region.

6. The semiconductor transistor of claim 1 wherein the second depth of the source region and the third depth of the drain region are asymmetrical, the second and third depths both being less than the first depth of the trench relative to the top surface of the semiconductor substrate.

7. A semiconductor transistor for low power applications formed in a semiconductor substrate having a top surface comprising:
   a well junction region of one conductivity type formed in the semiconductor substrate;
   a trench formed in the well junction region and intermediate the buried source region and the buried drain region and having substantially vertical sidewalls and a bottom surface at a first depth;
   a buried source region of opposite conductivity type formed in the well junction region having a lower boundary disposed at a second depth which is less than the first depth of the trench relative to the top surface of the semiconductor substrate;
   a buried drain region of opposite conductivity type formed in the well junction region spaced from the buried source region and having a lower boundary disposed at a third depth which is less than the first depth of the trench relative to the top surface of the semiconductor substrate;
   a channel region formed beneath the bottom surface of the trench;
   a trench-to-gate insulating layer formed on the vertical sidewalls and on the bottom surface inside the trench;
   a trenched floating gate electrode formed inside the trench and on the trench-to-gate insulating layer; the trenched floating gate electrode having a top surface which is disposed at approximately one half the first depth of trench;
   an inter-gate dielectric layer formed inside the trench and on the trenched floating gate electrode; and
   a trenched control gate electrode formed inside the trench and on the intergate dielectric layer; the trenched control gate electrode having a top surface which is substantially planar to the top surface of the semiconductor substrate.

8. The semiconductor transistor of claim 7 further comprising
   sidewall dopings of the opposite conductivity type formed in the buried source region and buried drain region immediately contiguous the upper substantially vertical sidewalls of the trench and the top surface of the semiconductor substrate, and partially extending into the buried source and buried drain regions.

9. The semiconductor transistor of claim 7 further comprising:
- an implanted region formed in the semiconductor substrate and immediately contiguous the upper vertical sidewalls of the trench and the substrate surface.

10. A semiconductor device for low power applications supported on a semiconductor substrate of one conductivity type comprising an array of multiple device structures, each device structure being spaced from other device structures and comprising:
- a well junction region formed in the semiconductor substrate having a top surface;
- a trench having substantially vertical sidewalls and a bottom surface formed in the well junction region, the bottom surface of the trench having a first depth below said top surface;
- a trench-to-gate insulating layer disposed inside the trench and formed on the substantially vertical sidewalls and the bottom surface of the trench;
- a trenched floating gate electrode disposed inside the trench and formed on the trench-to-gate insulating layer to a depth below said top surface;
- an inter-gate dielectric layer disposed inside the trench and formed on the trenched floating gate electrode;
- a trenched control gate electrode disposed inside the trench and formed on the inter-gate dielectric layer, the trenched control gate electrode having a second depth; and
- a source region and a drain region formed in the well junction region of the semiconductor substrate.

11. The semiconductor device of claim 10 further comprising:
- sidewall dopings formed in the semiconductor substrate, the sidewall dopings being immediately contiguous to the vertical sidewalls of the trench and immediately contiguous the top surface of the semiconductor substrate.

12. The semiconductor device of claim 10 wherein the sidewall dopings extend laterally into the substrate and have a third depth relative to a top surface of the device which is greater than the second depth of the trenched control gate electrode and less than the first depth of the trench.

13. The semiconductor device of claim 10 wherein the source region is a buried source region and the drain region is a buried drain region.

14. The semiconductor device of claim 10 further comprising an implanted region formed in the semiconductor substrate and immediately contiguous the substantially upper vertical sidewalls of the trench and the substrate surface.

* * * * *